(12) United States Patent
Hashimoto

(10) Patent No.: US 6,627,994 B2
(45) Date of Patent: *Sep. 30, 2003

(54) SEMICONDUCTOR DEVICE AND FILM CARRIER TAPE

(75) Inventor: Nobuaki Hashimoto, Sawa (JP)

(73) Assignee: Seiko Epson Corporation, Tokyo (JP)

(*) Notice: Subject to any disclaimer, the term of this patent is extended or adjusted under 35 U.S.C. 154(b) by 82 days.

This patent is subject to a terminal disclaimer.

(21) Appl. No.: 09/908,544

(22) Filed: Jul. 20, 2001

(65) Prior Publication Data

US 2001/0040291 A1 Nov. 15, 2001

Related U.S. Application Data

(62) Division of application No. 09/180,895, filed as application No. PCT/JP98/01153 on Mar. 18, 1998.

(30) Foreign Application Priority Data

Mar. 21, 1997 (JP) .............................. 9-087445

(51) Int. Cl.$^7$ .................... H01L 23/48; H01L 23/52; H01L 23/28; H01L 21/44; H01L 21/50; H01L 23/04; H01L 29/40; H01L 23/29; H01L 21/48

(52) U.S. Cl. .................... 257/739; 257/698; 257/668; 257/775; 257/786; 257/788; 257/734; 438/118; 438/112; 438/127

(58) Field of Search .................... 257/673, 666, 257/696, 698, 668, 775, 784, 786, 787, 788, 737, 734, 738, 739; 438/118, 112, 127

(56) References Cited

U.S. PATENT DOCUMENTS 4,151,543 A  4/1979  Hayakawa et al.
5,019,944 A  5/1991  Ishii et al.
5,122,860 A  6/1992  Kikuchi et al.
5,602,059 A  2/1997  Horiuchi et al.
5,683,943 A  11/1997 Yamada
5,738,928 A  4/1998  Kodani et al.
5,782,638 A  7/1998  Warren et al.
5,895,234 A  4/1999  Taniguchi et al.
5,970,320 A  10/1999 Yamasaki et al.
6,005,288 A * 12/1999 Farnworth et al. .......... 257/693
6,071,755 A  6/2000  Baba et al.
6,279,226 B1 * 8/2001  Ohkubo et al. ................ 29/740
6,316,288 B1 * 11/2001 Hashimoto .................. 438/118

FOREIGN PATENT DOCUMENTS

| JP | 64-39794   | 2/1989  |
| JP | 64-73730   | 3/1989  |
| JP | A-3-6828   | 1/1991  |
| JP | 03276739 A | 12/1991 |
| JP | A-5-95027  | 4/1993  |
| JP | 5-95027    | 4/1993  |
| JP | 5-160208   | 6/1993  |
| JP | A-8-139126 | 5/1996  |

* cited by examiner

*Primary Examiner*—Minh Loan Tran
*Assistant Examiner*—Victor A. Mandala, Jr.
(74) *Attorney, Agent, or Firm*—Oliff & Berridge, PLC

(57) ABSTRACT

The present invention is a semiconductor device with improved adhesion properties of a resin with a wiring pattern, comprising a film fragment 14 having a patterned wiring pattern 16 including a projection 17, a semiconductor chip 12 having electrodes 13 bonded to the projection 17, and a resin 19 provided to the wiring pattern 16 in the region other than that of the projection 17; and the wiring pattern 16 has its surface of contact with the resin 19 roughened.

9 Claims, 9 Drawing Sheets

SEMICONDUCTOR DEVICE AND FILM CARRIER TAPE

This is a Division of application Ser. No. 09/180,895 filed May 11, 1999, which is a U.S. National Stage PCT/JP98/01153, filed Mar. 18, 1998. The entire disclosure of the prior application(s) is hereby incorporated by reference herein in its entirety.

TECHNICAL FIELD

The present invention relates to a semiconductor device and film carrier tape, and methods of manufacture of the same.

BACKGROUND ART

As a semiconductor device package type is known the construction in which a substrate on which external electrodes are formed is adhered to a semiconductor chip. Commonly in such a package, a resin is provided between the substrate and the semiconductor chip, bringing the two into intimate contact. Such packages are applied to technologies such as Chip Size/Scale Package (CSP) technology and Tape Ball Grid Array (T-BGA) technology, and further to Tape Automated Bonding (TAB) technology.

However, when the wiring pattern connected to the external electrodes is formed on the substrate on a side of the active surface of the semiconductor chip, there is the problem of impairment of the adhesion properties of the wiring pattern and resin.

In particular, when the wiring pattern is half-etched to form a projection that is connected to the semiconductor chip electrodes, the wiring pattern is given a mirror surface by the etching process, seriously impairing the adhesion properties with the resin.

The object of the present invention is the provision of a semiconductor device and film carrier tape, and methods of manufacture of the same such that the adhesion properties of the wiring pattern with the resin are improved.

SUMMARY OF THE INVENTION

The method of manufacture of a semiconductor device of the present invention comprises:

a first step of forming on an insulating film a wiring pattern, at least a part of which is subjected to roughening processing; and a second step in which on the surface of the wiring pattern subjected to roughening processing, at least one application of resin is made.

As a result of the roughening processing of the wiring pattern, the adhesion properties with the resin are excellent.

The first step may include: a step of forming a metal film on the insulating film; and thereafter in any order, steps of patterning the metal film to form the wiring pattern, and of applying roughening processing to at least a part of the metal film.

In the first step, in order that a particular part of the metal film forms a projection, regions of the metal film other than the projection may be etched, and thereafter, the etched surface of the metal film may be subjected to roughening processing.

By means of this, the metal film is etched to form the projection. Therefore, the etched surface is given a mirror finish, but by further carrying out roughening processing fine irregularities are formed and the adhesion properties with the resin are made excellent. It should be noted that the resin is provided to protect the metal film, and according to requirement during the process of manufacture.

The metal film may be etched so that the projection projects in the direction opposite to the surface of contact with the insulating film.

In this case, after the patterning, etching, and roughening the metal film, there may further be a step in which the metal film is opposed to the surface of a semiconductor chip having an electrode, the insulating film is disposed, and the projection and the electrode are positioned and bonded; and the resin may be provided between the insulating film and the semiconductor chip.

By means of this, the resin provided between the insulating film and the semiconductor chip intimately contacts the metal film which has been subjected to roughening processing, and therefore the occurrence of package cracks can be prevented.

The insulating film may have a device hole, and the metal film may be formed so as to project into the device hole; and the metal film may be etched so that within the device hole the projection projects in the direction of the surface of contact with the insulating film.

After the steps of the etching and the roughening processing, and before the step of the patterning, disposition of the resin may be carried out. In the step of disposing the resin, within the device hole, the back-filling resin may be provided on the surface of the metal film on a side of the insulating film, and the metal film may be patterned from the surface opposite to a surface on which the resin for back-filling is provided, then the back-filling resin may be removed.

By means of this, since the back-filling resin is provided after the roughening processing, the adhesion between the metal film and the resin is improved, and thereafter during the patterning the etching fluid can be prevented from entering between the metal film and the resin.

In the method of manufacture of a semiconductor device of the present invention, after the patterning, etching, and roughening the metal film, there may further be a step in which the metal film is opposed to the surface of a semiconductor chip having an electrode, the insulating film is disposed, and the projection and the electrode are positioned and bonded; and in the step of disposing the resin, resin for sealing may be provided so as to seal the etched surface of the metal film and also the semiconductor chip.

By means of this, the resin for sealing forms an intimate contact with the metal film subjected to roughening processing, and the occurrence of package cracks can be prevented.

The roughening processing may be a chemical abrasion process of surface roughening.

The metal film may have resist provided on the particular part, and be etched to form the projection, and before the removal of the resist, the roughening processing may be carried out.

By means of this, roughening processing is carried out while the projection is covered by the resist, and the projection can be prevented from being subjected to roughening processing.

The method of manufacture of a film carrier tape of the present invention comprises a step of forming on an insulating film a wiring pattern, at least a part of which is subjected to roughening processing.

According to the present invention, since the wiring pattern is subjected to roughening processing, the adhesion properties with the resin during the manufacture of the semiconductor device are excellent.

The method of manufacture of a film carrier tape may further comprise: a step of forming a metal film on the insulating film; and thereafter in any order, steps of patterning the metal film to form the wiring pattern, and of applying roughening processing to at least a part of the metal film.

In order that a particular part of the metal film forms a projection, regions of the metal film other than the projection may be etched, and thereafter, the etched surface of the metal film may be subjected to roughening processing.

By means of this, the metal film is etched to form the projection. Therefore, the etched surface is given a mirror finish, but by further carrying out roughening processing fine irregularities are formed. Thus the adhesion properties with the resin, provided to protect the metal film and according to requirement during the process of manufacture, can be improved.

The metal film may be etched so that the projection projects in the direction opposite to the surface of contact with the insulating film.

The insulating film may have a device hole, and the metal film be formed so as to project into the device hole; and the metal film may be etched so that within the device hole the projection projects in the direction of the surface of contact with the insulating film.

After the steps of the etching and the roughening processing, and before the step of the patterning, disposition of resin may be carried out; and in the step of disposing the resin, within the device hole, the back-filling resin may be provided on the surface of the metal film on a side of the insulating film, and the metal film may be patterned from the surface opposite to that of the disposition of the back-filling resin, then the back-filling resin may be removed.

By means of this, since the back-filling resin is provided after the roughening processing, the adhesion between the metal film and the resin is improved, and thereafter during the patterning the etching fluid can be prevented from entering between the metal film and the resin.

The insulating film may have a device hole, and the metal film be formed so as to project into the device hole; and the metal film may be etched so that within the device hole the projection projects in the direction opposite to the surface of contact with the insulating film.

The roughening processing may be a chemical abrasion process of surface roughening.

The metal film may have resist provided on the particular part, and be etched, and before the removal of the resist, a step to roughen the surface may be carried out.

By means of this, roughening processing is carried out while the projection is covered by the resist, and the projection can be prevented from being subjected to roughening processing.

The semiconductor device of the present invention comprises: an insulating film having a wiring pattern, a semiconductor chip having electrodes bonded to the wiring pattern, and a resin provided to the wiring pattern; and the wiring pattern has a roughened surface of contact with the resin.

According to the present invention, the surface of the wiring pattern with which the resin contacts is roughened, and therefore the two are in intimate contact, and the occurrence of package cracks can be prevented.

The wiring pattern may include a projection, the electrodes may be bonded to the projection, and in regions other than that of the projection the resin may be provided on the wiring pattern.

The film carrier tape of the present invention comprises an insulating film, and a wiring pattern subjected to roughening processing.

The wiring pattern may include a projection, and the wiring pattern may have a roughened surface on a side on which the projection projects.

DETAILED DESCRIPTION OF PREFERRED EMBODIMENTS

The present invention is now described in terms of a number of preferred embodiments, with reference to the drawings.

First Embodiment

Figure 1:
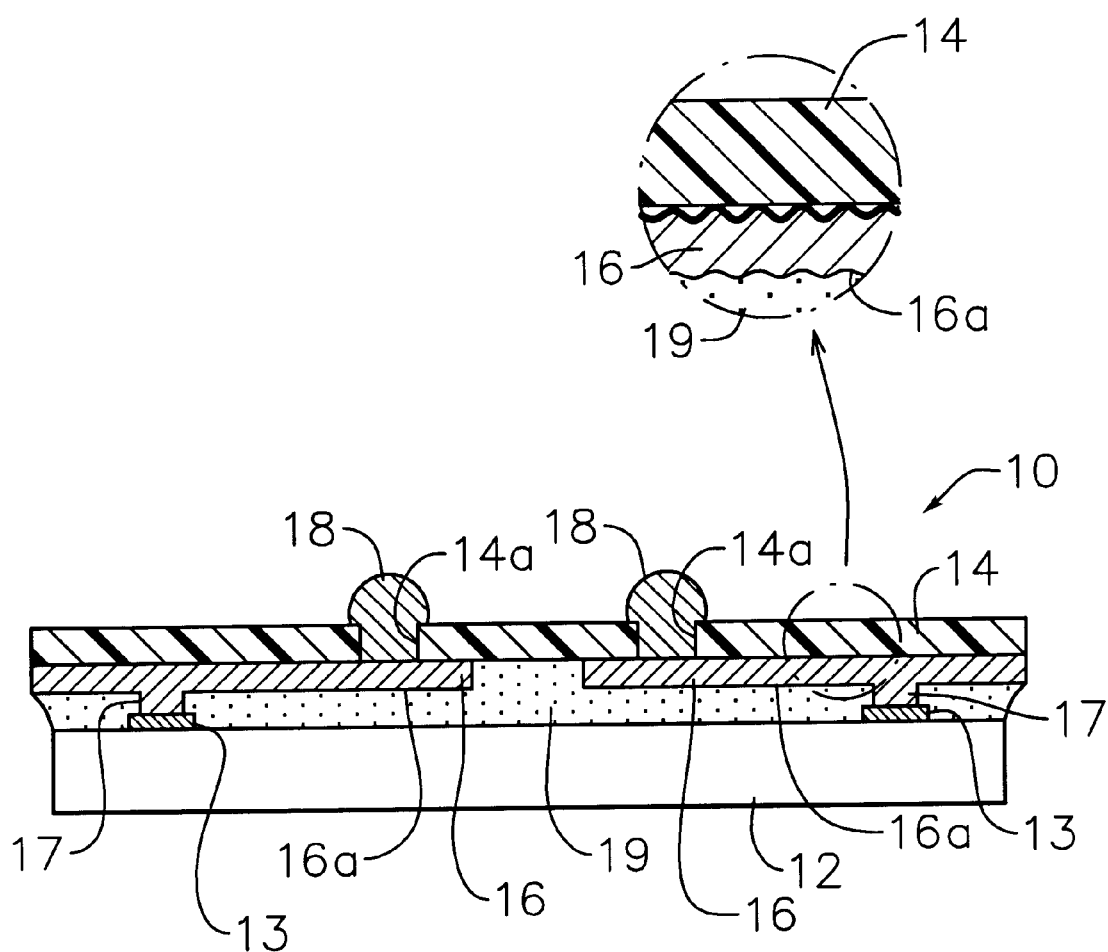
FIG. 1 shows a first embodiment of the semiconductor device.

FIG. 1 shows a first embodiment of the semiconductor device. A semiconductor device 10 has electrodes 13 of a semiconductor chip 12 bonded to a projection 17 of a wiring pattern 16 formed on a film fragment 14, and external terminals 18 are formed on the wiring pattern 16. Between the film fragment 14 and semiconductor chip 12 is provided a resin 19 for the purposes of relieving stress and protecting the active surface of the semiconductor chip.

More specifically, the film fragment 14 is formed by stamping from a film carrier tape, and includes a polyimide resin, with the wiring pattern 16 attached to one surface by an adhesive not shown in the drawings.

The wiring pattern 16 is formed to have the thick projection 17, and the remaining regions are thin. By the formation of the projection 17, a gap is formed so that between the wiring pattern 16 and the semiconductor chip 12 can be filled with the resin 19. On the surface 16a of the wiring pattern 16 opposite to the surface to which the film fragment 14 is adhered, (that is to say, on the surface of the wiring pattern 16 facing the semiconductor chip 12), as shown in enlargement in FIG. 1, are formed fine irregularities.

The external terminals 18 are formed of balls of solder, to project from the film fragment 14, on the opposite surface to the surface on which the wiring pattern 16 is provided. In more detail, the film fragment 14 has fine holes 14a formed such that solder can be placed on the wiring pattern 16, and the external terminals 18 are formed so as to project to the exterior of the wiring pattern 16 from the holes 14a.

The resin 19 is a material with a low Young's modulus, which provides a stress relieving function. As examples may be cited polyimide resin, silicone denatured polyimide resin, epoxy resin, and silicone denatured epoxy resin. The resin 19, by being provided between the film fragment 14 and the semiconductor chip 12, is able to relieve stress applied from the exterior to the external terminals 18.

The resin 19, as shown in FIG. 1, contacts the surface 16a of the wiring pattern 16. As described above, on the surface 16a of the wiring pattern 16 are formed fine irregularities, increasing the surface area. It should be noted that the fine irregularities referred to here indicates in more concrete terms a surface roughness preferably of 10 μm or less (distance between adjacent peaks), excluding smooth or mirror-etched surfaces. At the surface of adhesion between the film fragment 14 and wiring pattern 16, to improve the adhesion properties of both (the film fragment 14 and the wiring pattern 16), irregularities can be formed in the wiring pattern 16. As far as the surface 16a has fine irregularities, the irregularities formed in the surface 16a of the wiring pattern 16 can be finer than the irregularities formed on the opposite surface of the wiring pattern 16 from the surface 16a. As a result, the adhesion properties between the surface 16a and the resin 19 are excellent, and the construction is such that package cracks tend not to form between the two.

This embodiment is constructed as described above, and its process of manufacture is now described. FIGS. 2A to 4B show the process of manufacture of this embodiment of the semiconductor device. In this process of manufacture, TAB technology is applied, and a film carrier tape 20 is used. Here the term "film carrier tape" refers to a longitudinally extended film which is both insulating and flexible, of a material such as polyimide, glass epoxy, BT resin or a polyester material. It should be noted that either before or after the semiconductor chip is mounted, a part of the film carrier tape 20 is stamped out (cut away) to form the film fragment 14 (see FIG. 1).

Figure 2A:
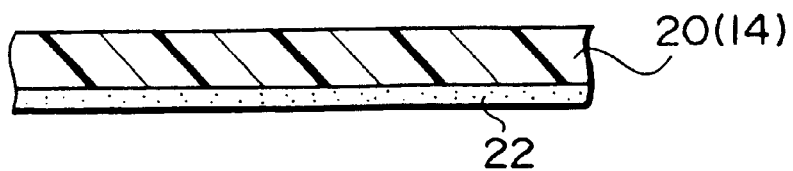
FIG. 2A to FIG. 2E illustrate the process of manufacture of the first embodiment of the semiconductor device.
Figure 2B:
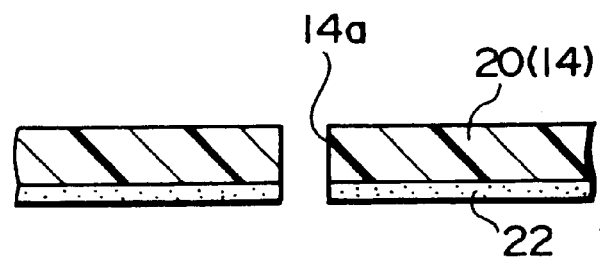

First, as shown in FIG. 2A, an adhesive 22 is spread on one surface (here the back surface is used) of the film carrier tape 20, and as shown in FIG. 2B, holes 14a and the like are formed in the film carrier tape 20, by stamping with a press, by laser machining, by chemical etching, or other means. The holes 14a are used as shown in FIG. 1 for providing the external terminals 18.

Figure 2C:
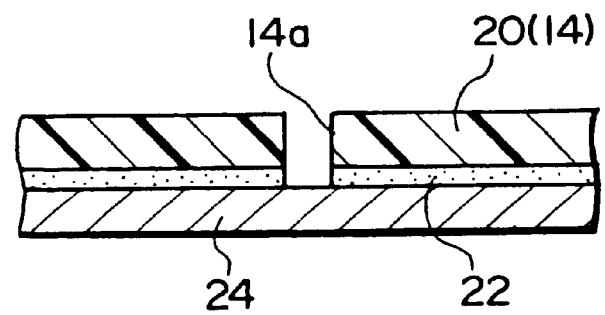

Then as shown in FIG. 2C, with the adhesive 22 interposed, a copper film 24 being a metal film is adhered to the back surface of the film carrier tape 20 including the holes 14a. The copper film 24 is patterned to a predetermined form. The steps shown in FIG. 2D and subsequent figures are carried out for this purpose.

It should be noted that in this embodiment, the holes 14a and so forth are formed before the copper film 24 is attached, but this is not limiting on the invention, and there may equally be a step of forming the holes after the copper film 24 is attached. According to this method, a difficult step of handling the film carrier tape 20 with adhesive 22 applied which is not yet set is avoided, and the process is one of handling the film carrier tape 20 when curing of the adhesive 22 is completed, and attachment of the copper film 24 is completed. For this reason, the handling may be somewhat rough, and therefore the processing is not restricted, and there is the benefit that the flexibility of the process for forming the holes 14a and the like is increased. In this case, to form the holes 14a in the film carrier tape 20 after the copper film 24 is attached, without forming holes in the copper film 24, laser machining, chemical etching, or another method is commonly used.

Figure 2D:
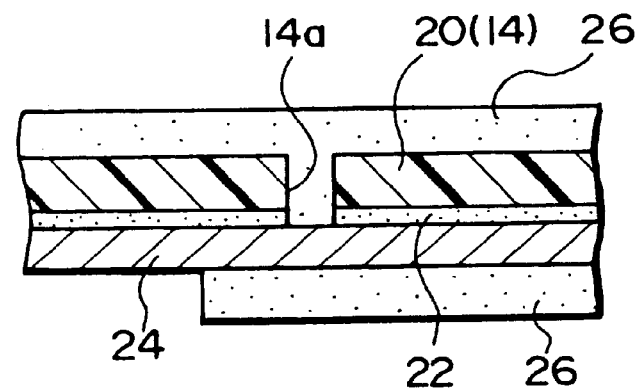
Figure 2E:
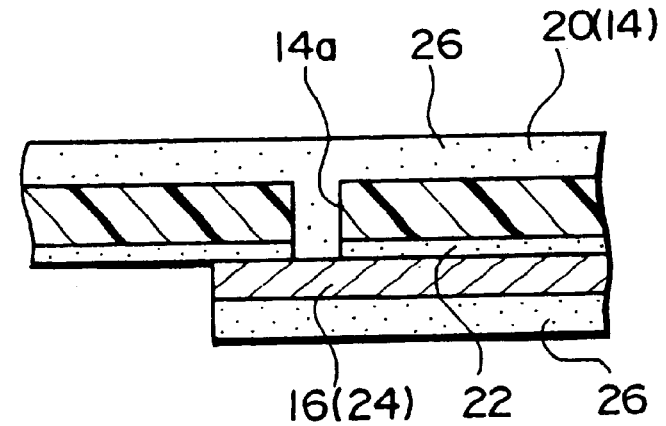

Next, as shown in FIG. 2D, a resist 26 is painted on the film carrier tape 20, and the copper film 24 is etched, so that as shown in FIG. 2E, the desired pattern (the wiring pattern 16 shown in FIG. 1) is formed.

In more detail, the resist 26 is painted on both surfaces of the film carrier tape 20, exposure and development to remove the resist 26 from the region to be etched is carried out, and the regions of the copper film 24 not covered by the resist 26 are etched. For the etching, a well-known etchant (for example, an aqueous solution of ferric chloride or cupric chloride) is used.

Alternatively, in place of a subtractive method such as etching, an additive method may be used to form the wiring pattern 16. For example, on the film carrier tape 20 a metal thin film such as of copper may be formed in the shape of the wiring pattern 16 by sputtering, and a thick metal film may be formed thereon by electroplating.

Figure 3A:
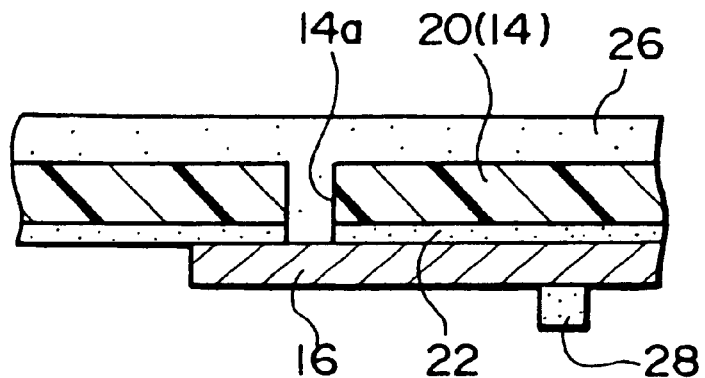
FIG. 3A to FIG. 3C illustrate the process of manufacture of the first embodiment of the semiconductor device.

Then the resist 26 on the wiring pattern 16 is removed, and as shown in FIG. 3A, a resist 28 is painted on the region in which the projection 17 of the wiring pattern 16 (see FIG. 1) is to be formed. In more detail, by means of exposure and development, the resist 28 is left in this region only.

Figure 3B:
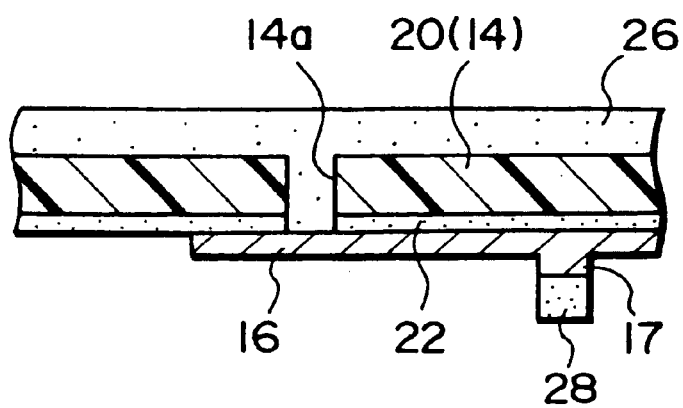
Figure 3C:
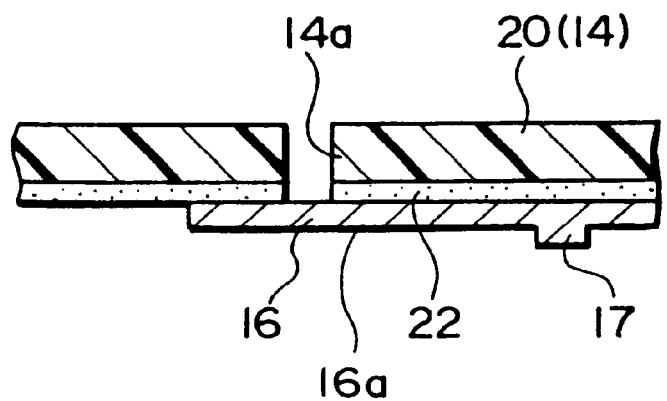

Next, as shown in FIG. 3B, the wiring pattern 16 is half-etched in the thickness direction. This etching is carried out for a shorter time than that to move from the state of FIG. 2D to that of FIG. 2E. In this way, the wiring pattern 16 is made thinner in the region not covered by the resist 28, and therefore the region covered by the resist 28 becomes relatively thicker. Then the resist 26 and the resist 28 on the opposite side of the wiring pattern 16 are removed, and as shown in FIG. 3B, the projection 17 is formed.

Here the surface of the wiring pattern 16 formed by etching has a mirror surface. Since the wiring pattern 16 is etched by a chemical process using an etching fluid, the surface 16a which is etched has a mirror surface.

Figure 4A:
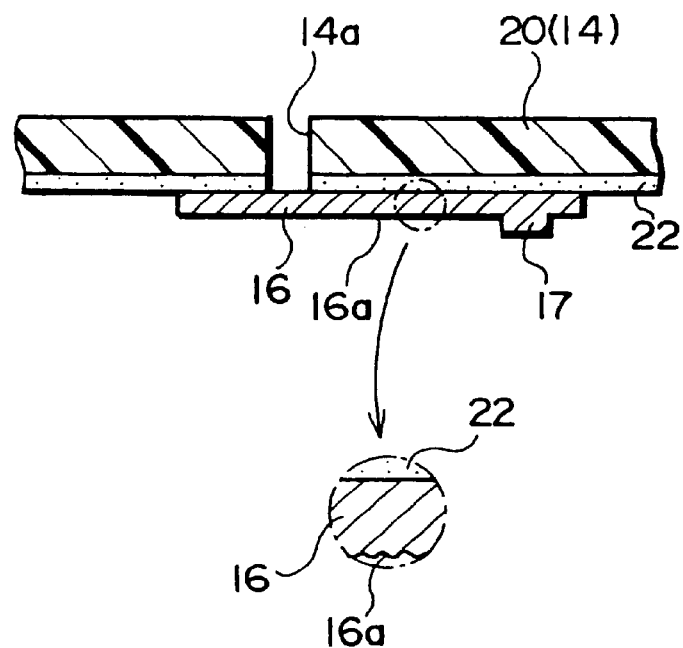
FIG. 4A and FIG. 4B illustrate the process of manufacture of the first embodiment of the semiconductor device.

In this embodiment, as shown in the enlargement in FIG. 4A, a characteristic is that the surface 16a is subjected to roughening processing. In more detail, by a chemical abrasion process for roughening the surface, fine irregularities are formed on the surface 16a. By this means, the adhesion properties of the resin 19 (see FIG. 1) and the surface 16a, that is to say, the anchoring characteristics, can be improved. It should be noted that in the chemical abrasion process, for example CPE-750 (Mitsubishi Gas Chemical) or the like can be used.

Alternatively, as a roughening processing may be used a method of sand-blasting, or an oxygen plasma. Also, if the wiring pattern 16 is formed by electroplating, the surface may be roughened by plating with an elevated current density.

Figure 4B:
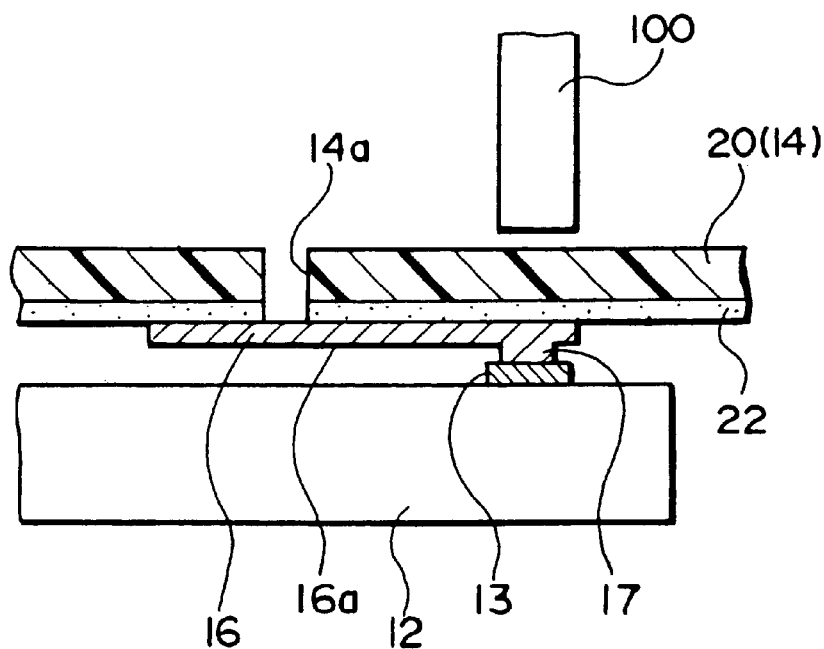

Next, as shown in FIG. 4B, the electrodes 13 of the semiconductor chip 12 and the projection 17 of the wiring pattern 16 are positioned, and connected together. In more detail, using a bonding tool 100 from over the film carrier tape 20, the projection 17 is clamped against the electrodes 13 while being subject to ultrasonic vibration, so as to form an alloy from the copper (Au) constituting the projection 17 and the aluminum (Al) constituting the electrodes 13.

It should be noted that in this embodiment, since the chemical abrasion process is carried out after removing the resist 28 (see FIG. 3B) on the projection 17, not only the etched surface 16a of the wiring pattern 16, but also the surface of the projection 17 is subjected to roughening processing. As a result, plastic deformation of the projection 17 by the ultrasonic vibration is promoted, and the step of connecting the projection 17 and the electrodes 13 can be carried out rapidly.

If roughening processing is not required for the surface of the projection 17, this can be provided by carrying out a chemical abrasion process before removing the resist 28 from the projection 17.

Thereafter, the resin 19 (see FIG. 1) is injected between the film carrier tape 20 and the semiconductor chip 12 and subjected to heat curing, and the holes 14a are filled with solder to form the external terminals (solder balls) 18.

Then from the film carrier tape 20 the film fragment 14 is cut, and the semiconductor device 10 shown in FIG. 1 is obtained.

It should be noted that in this embodiment, as shown in FIG. 4B, a B-TAB type of bonding method is applied, but other well-known methods, such as for example the method using an adhesive of anisotropic conductivity may equally be applied. The well-known method of a normal TAB type bonding method (the method of connecting the wiring pattern 16 to electrodes 13 having projections) may be used.

Second Embodiment

Figure 5A:
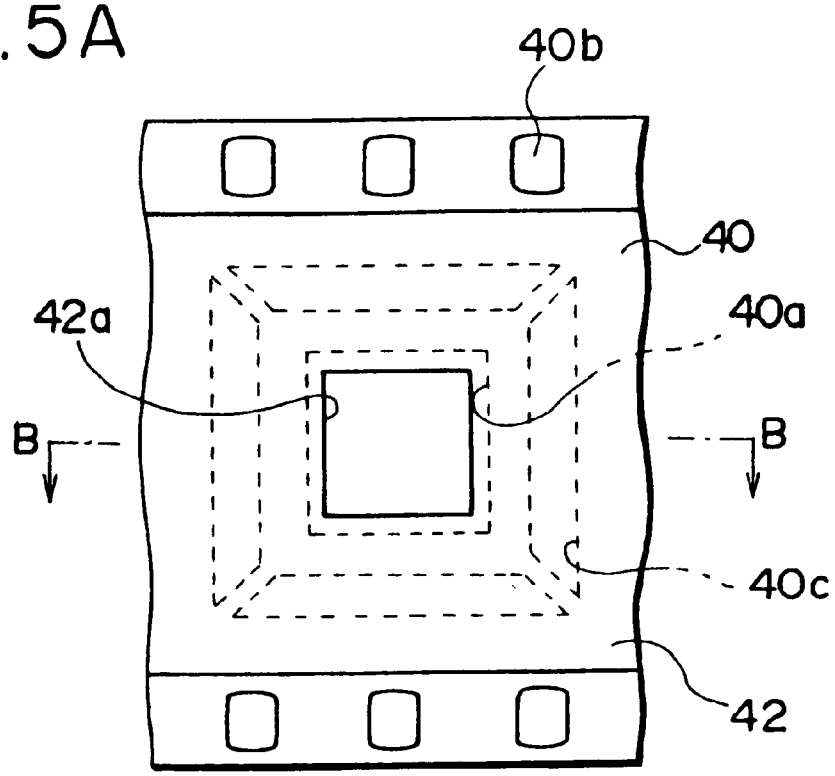
FIG. 5A and FIG. 5B illustrate the process of manufacture of a second embodiment of the semiconductor device.
Figure 5B:
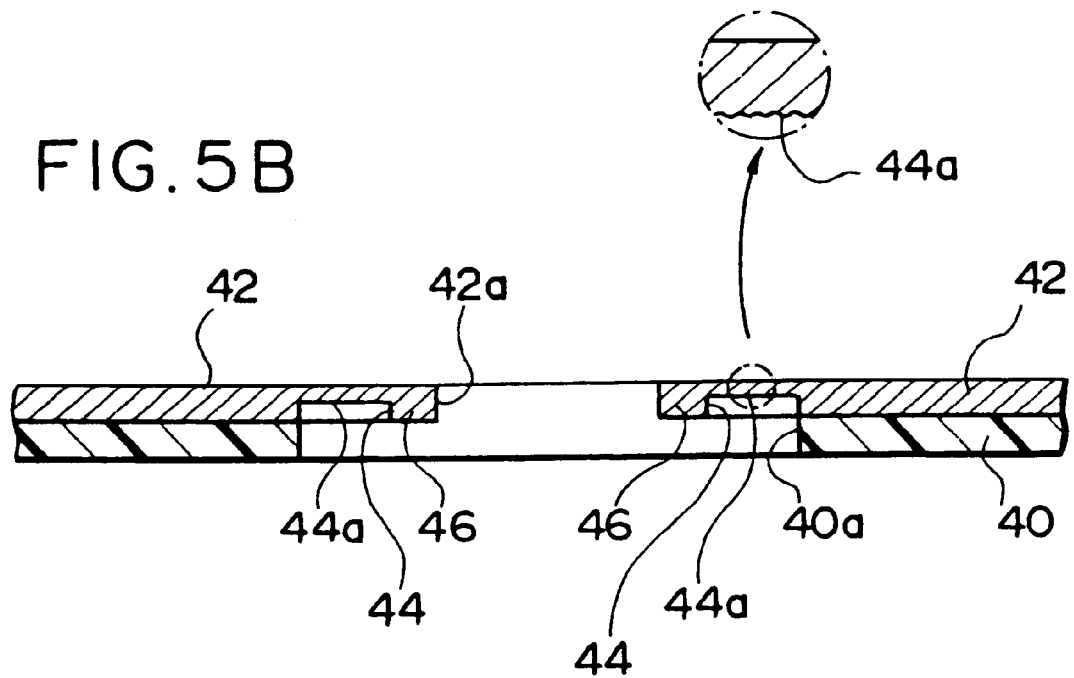
Figure 6A:
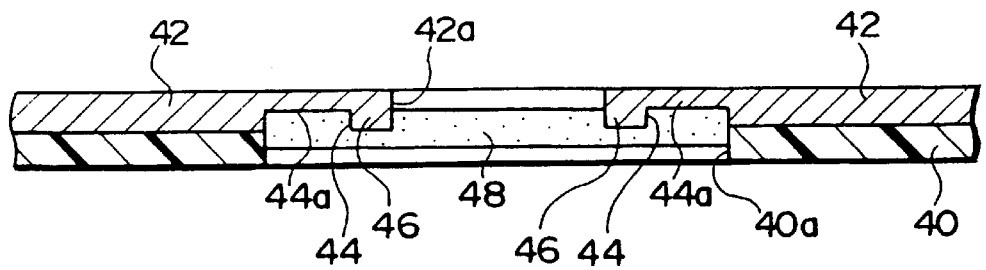
FIG. 6A to FIG. 6C illustrate the process of manufacture of the second embodiment of the semiconductor device.
Figure 6B:
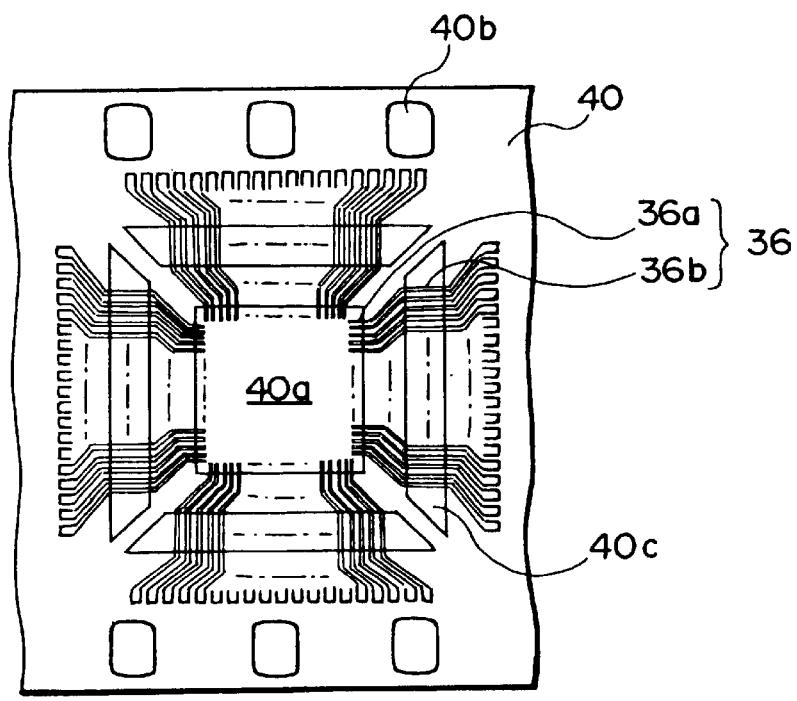
Figure 6C:
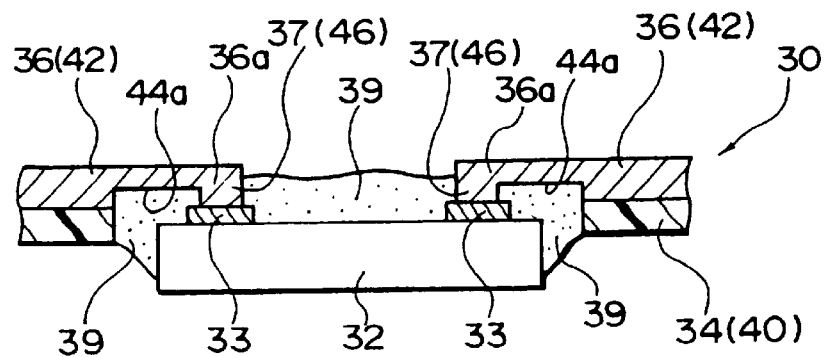

FIGS. 5A to 6C show a process of manufacture of a second embodiment of the semiconductor device. In this embodiment, the present invention is applied to TAB technology. As shown in FIG. 6C, a semiconductor device 30 has projections 37 of a wiring pattern 36 formed on a film fragment 34 bonded to electrodes 33 of a semiconductor chip 32. In order to seal the film fragment 34 and semiconductor chip 32, a resin 39 is provided. In this embodiment again, TAB technology is applied, and the film fragment 34 is formed by cutting out from a film carrier tape 40 shown in FIG. 6B.

In more detail, in the film carrier tape 40 are formed a device hole 40a, sprocket holes 40b, outer lead holes 40c, and so forth. The film carrier tape 40 has a plurality of pieces of wiring pattern 36 formed. Each piece of the wiring pattern 36 includes an inner lead 36a and an outer lead 36b. The formation of the wiring pattern 36 on the film carrier tape 40 is carried out as follows.

First, as shown in FIG. 5A, on the film carrier tape 40 with the sprocket holes 40b, outer lead holes 40c, and so forth formed, a copper film 42 is adhered using an adhesive not shown in the drawings. The copper film 42 has formed an oblong hole 42a on the inside of and approximating in shape to the device hole 40a, and the region other than this oblong hole 42a is arranged to cover the outer lead holes 40c of the film carrier tape 40.

In the region extending inward from the device hole 40a, etching is carried out so that a part of the copper film 42 is made thinner, and this etched surface is subjected to roughening processing. That is to say, as shown in FIG. 5B, on the surface of the copper film 42 on the side of the film carrier tape 40, etching is carried out, leaving the extremity, to form a groove 44. It should be noted that FIG. 5B is a section corresponding to the line B—B in FIG. 5A. The surface 44a of the bottom of the groove 44 is subjected to roughening processing. The methods of the etching and roughening processing are the same as in the first embodiment described above, and description is omitted here.

By the formation of this groove 44, within the device hole 40a, the extremity of the copper film 42 forms a relatively thick projection 46.

Next, as shown in FIG. 6A, within the device hole 40a, a resin 48 is provided to the copper film 42 from the side of the groove 44 and projection 46. That is to say, the surface of the copper film 42 on the side of the film carrier tape 40 is back-filled with the resin 48.

Then from the side opposite to that of the film carrier tape 40, the copper film 42 is patterned with an etching fluid, and as shown in FIG. 6B, the wiring pattern 36 is formed.

The portion of the copper film 42 in which the groove 44 and projection 46 are formed forms an inner lead 36a. In the portion forming an inner lead 36a, the surface 44a of the copper film 42 is subjected to roughening processing, and therefore the resin 48 makes an intimate contact. Therefore, when the copper film 42 is patterned, the etching fluid is prevented from access, and thinning of inner leads 36a or wiring breaks are avoided.

Using the thus obtained film carrier tape 40, the semiconductor chip 32 is mounted, the semiconductor chip 32 and inner lead 36a are sealed with the resin 39, the film carrier tape 40 is cut out, and a semiconductor device 30 having a film fragment 34 can be obtained.

Here, since the resin 39 also makes intimate contact with the surface 44a, the occurrence of package cracks can be prevented.

It should be noted that by making a modification to the external terminal section of this embodiment, a Tape Ball Grid Array (T-BGA) type semiconductor device can also be fabricated.

Third Embodiment

Figure 7:
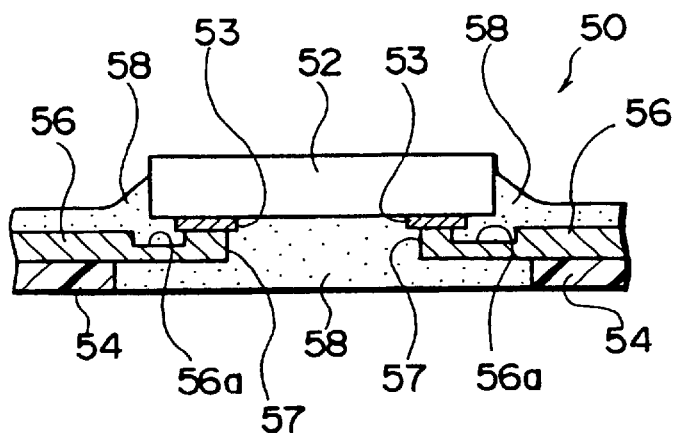
FIG. 7 shows a third embodiment of the semiconductor device.

FIG. 7 shows a third embodiment of the semiconductor device. A semiconductor device 50 shown in this figure has projections 57 of a wiring pattern 56 formed on a film fragment 54 bonded to electrodes 53 of a semiconductor chip 52. A resin 58 is provided to seal the film fragment 54 and semiconductor chip 52.

In this embodiment, the position of formation of the projections 57 is different from that in the second embodiment described above. Specifically, in this embodiment, the projections 57 are formed on the opposite side of the wiring pattern 56 from the film fragment 54.

In this embodiment also, the etched surface 56a of the wiring pattern 56 and the resin 58 form an intimate contact, and package cracks are prevented.

Fourth Embodiment

Figure 8:
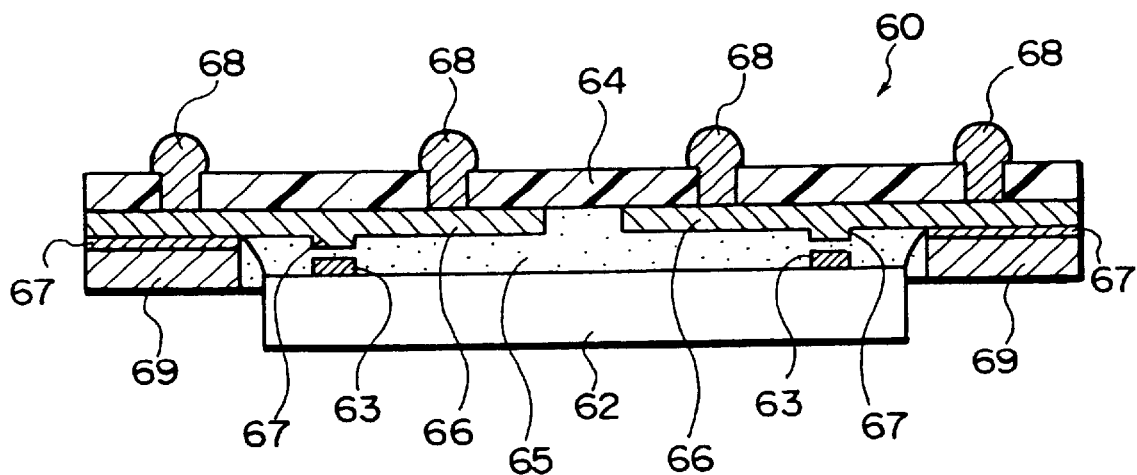
FIG. 8 shows a fourth embodiment of the semiconductor device.

FIG. 8 shows a fourth embodiment of the semiconductor device. This semiconductor device 60 has projections 67 of a wiring pattern 66 formed on a film fragment 64 bonded to electrodes 63 of a semiconductor chip 62, and the wiring pattern 66 is provided with external terminals 68. Between the film fragment 64 and the semiconductor chip 62 is injected a resin 65 for relieving stress.

Here, the projections 67 are formed in the same way as in the embodiment described above, and therefore the etched surface has a mirror finish, but by applying roughening processing thereto, the adhesion properties with the resin 65 are improved, and package cracks can be prevented.

In this embodiment, the film fragment 64 and wiring pattern 66 are formed to be larger than the outline of the semiconductor chip 62, and external terminals 68 are provided not only on the inside of the electrodes 63 of the semiconductor chip 62, but also on the outside. In other words, the semiconductor device 60 is of the so-called "FAN-IN/OUT" type.

A further characteristic of the present embodiment is that on the periphery of the semiconductor chip 62, a protective plate 69 is provided to the film fragment 64 from over the wiring pattern 66, with an insulating adhesive 67 interposed. The protective plate 69 is flat, and has sufficient strength to maintain this flatness.

By this means, the stability of planarity of the external terminals 68 disposed on the outside of the semiconductor chip 62 is improved.

Other Embodiments

In all of the embodiments described above, projections are formed on the wiring pattern, but the present invention can also be applied in the case that there are no projections. For example, even in the case that the wiring pattern is not subjected to half-etching, by carrying out roughening processing on the wiring pattern the adhesion properties with the resin can be improved. In this case, after the roughening processing is applied to a metal film such as a copper film, this may be patterned to the form of the wiring pattern.

Figure 9:
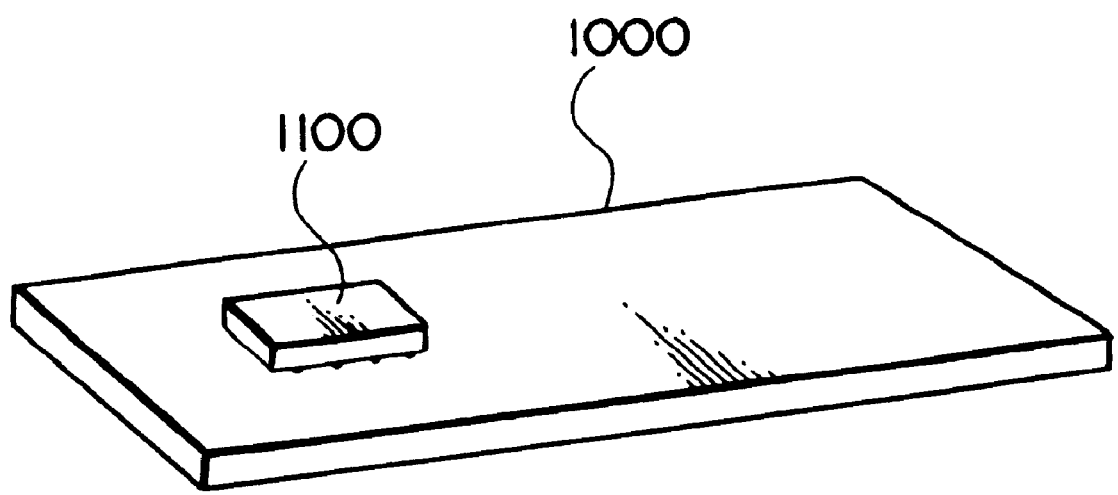
FIG. 9 shows a circuit board on which is mounted a semiconductor device to which the present invention is applied.

In FIG. 9 is shown a circuit board 1000 on which is mounted a semiconductor device 1100 to which the present invention is applied. The circuit board 1000 generally uses an organic substrate such as a glass epoxy substrate. On the circuit board 1000 is formed a wiring pattern of for example copper to form a desired circuit, and by mechanical connection of the wiring pattern and the bumps of the semiconductor device 1100, the electrical connection is achieved. In this case, the semiconductor device 1100 is provided with a construction as described above for absorbing strain generated by differences in thermal expansion with the exterior, and when this semiconductor device 1100 is mounted on the circuit board 1000 and thereafter, the reliability can be improved. If appropriate attention is paid to the wiring of the semiconductor device 1100, the reliability during connection and the reliability after connection can be improved. It should be noted that the mounting area can also be reduced to the area for mounting as a bare chip. Therefore, when this circuit board 1000 is used in an electronic instrument, the electronic instrument itself can be made more compact. Within the same area, greater effective mounting space can be made available, and it is possible to design for greater functionality.

Figure 10:
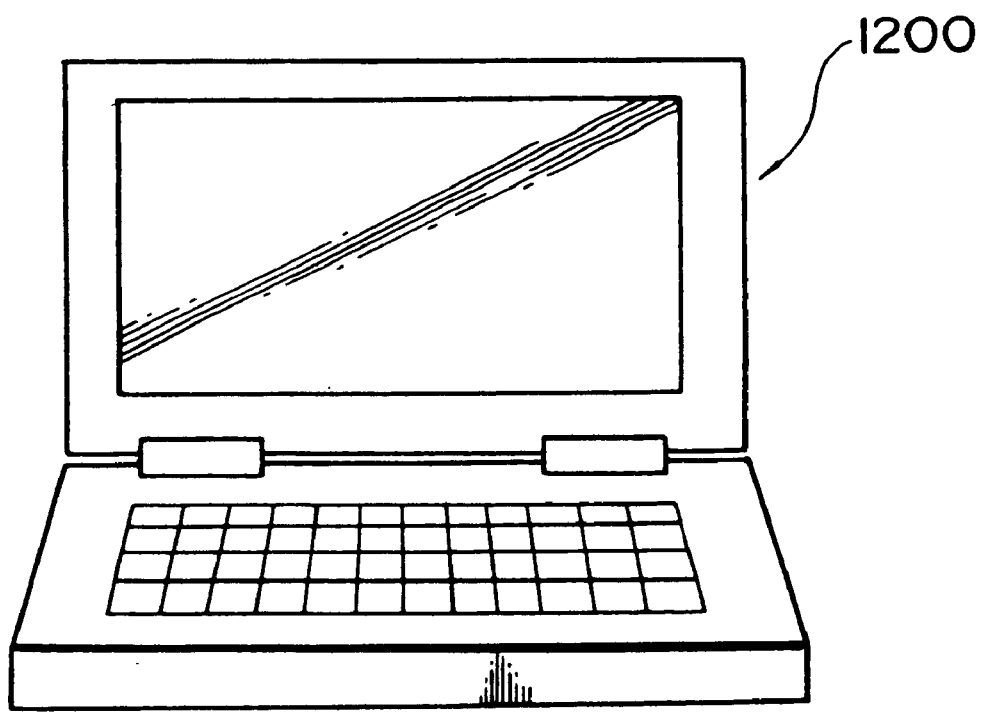
FIG. 10 shows an electronic instrument provided with a circuit board on which is mounted a semiconductor device to which the present invention is applied.

As an electronic instrument provided with this circuit board 1000, FIG. 10 shows a notebook personal computer 1200.

It should be noted that the above described embodiments are examples of the present invention applied to a semiconductor device, but the present invention can be applied to any surface-mounted electronic component which, similar to a semiconductor device requires a plurality of bumps, whether active or passive. Electronic components include, for example, resistors, capacitors, coils, oscillators, filters, temperature sensors, thermistors, varistors, variable resistors, and fuses.

What is claimed is:

1. A semiconductor device comprising:
   an insulating film having a wiring pattern;
   a semiconductor chip having electrodes bonded to said wiring pattern; and
   a resin provided on said wiring pattern, said wiring pattern having a first surface opposed to said insulating film and a second surface opposed to said semiconductor chip with said resin interposed therebetween, said second surface having irregularities formed thereon.

2. The semiconductor device as defined in claim 1, wherein said wiring pattern includes a projection, said electrodes are bonded to said projection, and in regions other than said projection said resin is provided on said wiring pattern.

3. A semiconductor device comprising:
   an insulating film having a wiring pattern;
   a semiconductor chip having electrodes bonded to said wiring pattern; and
   a resin provided on said wiring pattern, said wiring pattern having a first surface opposed to said insulating film and a second surface opposed to said semiconductor chip with said resin interposed therebetween, each of said first and second surfaces having irregularities formed thereon.

4. The semiconductor device as defined in claim 3, wherein said irregularities formed on said second surface are finer than said irregularities formed on said first surface.

5. The semiconductor device as defined in claim 3, wherein said wiring pattern includes a projection, said electrodes are bonded to said projection, and in regions other than said projection said resin is provided on said wiring pattern.

6. A semiconductor device obtained by a method comprising:
   a first step of forming on an insulating film a wiring pattern, at least a part of which is subjected to roughening processing; and
   a second step in which on a surface of said wiring pattern subjected to roughening processing, at least one application of resin is made.

7. The semiconductor device as defined in claim 6, wherein said first step includes;
   a step of forming a metal film on said insulating film; and
   thereafter in any order, steps of patterning said metal film to form said wiring pattern, and of applying roughening processing to at least a part of said metal film.

8. A semiconductor device comprising:
   a semiconductor chip having electrodes;
   an insulating film having a wiring pattern, said wiring pattern including projections facing and bonded to said electrodes; and
   a resin provided on said wiring pattern, said wiring pattern facing an active surface of said semiconductor chip, a surface of said wiring pattern contacted with said resin,
   wherein regions in said wiring pattern facing said active surface of said semiconductor chip, other than upper surfaces of said projections, are roughened to have a wider surface area than a smooth surface.

9. A film carrier tape obtained by a method comprising a step of forming on an insulating film a wiring pattern, at least a part of which is subjected to roughening processing for adhesion to resin,
   wherein said step of forming a wiring pattern comprises:
   a step of forming a metal film on said insulating film; and
   thereafter in any order, steps of patterning said metal film to form said wiring pattern, and of applying roughening processing to at least a part of said metal film.

* * * * *